United States Patent
Schier et al.

(10) Patent No.: US 8,691,378 B2
(45) Date of Patent: Apr. 8, 2014

(54) CUTTING TOOL

(75) Inventors: Veit Schier, Leinfelden-Echterdingen (DE); Oliver Eibl, Kirchentellinsfurt (DE); Wolfgang Engelhart, Metzingen (DE)

(73) Assignee: Walter AG, Tubingen (DE)

( * ) Notice: Subject to any disclaimer, the term of this patent is extended or adjusted under 35 U.S.C. 154(b) by 140 days.

(21) Appl. No.: 13/201,028

(22) PCT Filed: Mar. 18, 2010

(86) PCT No.: PCT/EP2010/053551
§ 371 (c)(1),
(2), (4) Date: Aug. 11, 2011

(87) PCT Pub. No.: WO2010/106142
PCT Pub. Date: Sep. 23, 2010

(65) Prior Publication Data
US 2011/0311805 A1 Dec. 22, 2011

(30) Foreign Application Priority Data
Mar. 19, 2009 (DE) .................. 10 2009 001 675

(51) Int. Cl.
C23C 14/08 (2006.01)
C23C 16/40 (2006.01)
B23B 27/14 (2006.01)

(52) U.S. Cl.
CPC .............. C23C 14/08 (2013.01); C23C 16/40 (2013.01); B23B 27/14 (2013.01); B23B 2228/08 (2013.01); B23B 2228/105 (2013.01)
USPC ............... 428/336; 51/307; 51/309; 428/697; 428/698; 428/699; 428/701; 428/702

(58) Field of Classification Search
USPC ............ 51/307, 309; 428/336, 697, 698, 699, 428/701, 702
See application file for complete search history.

(56) References Cited

U.S. PATENT DOCUMENTS

| | | |
|---|---|---|
| 5,516,588 A | 5/1996 | van den Berg et al. |
| 5,587,233 A | 12/1996 | König et al. |

(Continued)

FOREIGN PATENT DOCUMENTS

| | | |
|---|---|---|
| DE | 42 09 975 A1 | 9/1993 |
| EP | 1 029 105 | 8/2000 |

(Continued)

OTHER PUBLICATIONS

Ramm, J. et al., "Pulse enhanced electron emission (P3eTM) arc evaporation and the synthesis of wear resistant Al—Cr—O coatings in corundum structure", Surface & Coatings Technology 202, pp. 876-883, 2007.

(Continued)

Primary Examiner — Archene Turner
(74) Attorney, Agent, or Firm — Morgan, Lewis & Bockius LLP

(57) ABSTRACT

The invention relates to a cutting tool having a substrate base body and a single or multi-layered coating attached thereupon, wherein at least one layer of the coating is a metal oxide layer produced in the PVD process or in the CVD process and the metal oxide layer has a grain structure wherein there is structural disorder within a plurality of the existing grains that are characterized in that in electron diffraction images of the grains, point-shaped reflections occur up to a maximum lattice spacing $d_{GRENZ}$ and for lattice spacing greater than $d_{GRENZ}$ no point-shaped reflections occur, but rather a diffuse intensity distribution typical for amorphous structures.

24 Claims, 1 Drawing Sheet

Diffraction image of an aluminium oxide layer according to the invention; $d_{LIMIT}$ is marked and point-shaped reflections which lie on the rings are indicated in accordance with Table 1

(56) References Cited

U.S. PATENT DOCUMENTS

| | | |
|---|---|---|
| 6,210,726 B1 | 4/2001 | Schiller et al. |
| 8,025,991 B2 * | 9/2011 | Schier ............................ 428/701 |
| 8,173,278 B2 * | 5/2012 | Cremer ............................ 51/307 |
| 2004/0076857 A1 | 4/2004 | Sjolen et al. |
| 2007/0178330 A1 * | 8/2007 | Sjolen et al. .................. 428/697 |
| 2009/0252973 A1 | 10/2009 | Cremer |
| 2010/0189978 A1 * | 7/2010 | Schier ............................ 428/702 |
| 2010/0330360 A1 * | 12/2010 | Tanibuchi et al. ............ 428/332 |

FOREIGN PATENT DOCUMENTS

| | | | |
|---|---|---|---|
| EP | 1 253 215 | A2 | 10/2002 |
| EP | 1 400 293 | A2 | 3/2004 |
| JP | 59 028565 | | 2/1984 |
| JP | 2003-025114 | * | 1/2003 |
| JP | 2005-262355 | | 9/2005 |
| WO | 92/17623 | | 10/1992 |
| WO | 99/24634 | | 5/1999 |
| WO | 2007/121954 | A1 | 11/2007 |

OTHER PUBLICATIONS

Trinh, D.H. et al. "Radio frequency dual magnetron sputtering deposition and characterization of nanocomposite Al2O3—ZrO2 thin films", J. Vac. Sci. Technol, A 24(2), pp. 309-316, 2006.

Teixeria, V., et al. "Deposition of composite and nanolaminate ceramic coatings by sputtering", Vacuum 67, pp. 477-483, 2002.

International Preliminary Report on Patentability and Written Opinion from application PCT/EP2010/053551 dated Sep. 29, 2011.

International Search Report from application PCT/EP2010/053551 dated Jun. 4, 2010.

German Search Report from related German Patent Application No. De 10 2009 001 675.9 dated Dec. 1, 2009.

Ghen et al., "Effects of deposition and annealing atmospheres on phase transition of tungsten oxide films grown by ultra-high-vacuum reactive sputtering" *Thin Solid Films*, vol. 493, pp. 301-306 (2005).

* cited by examiner

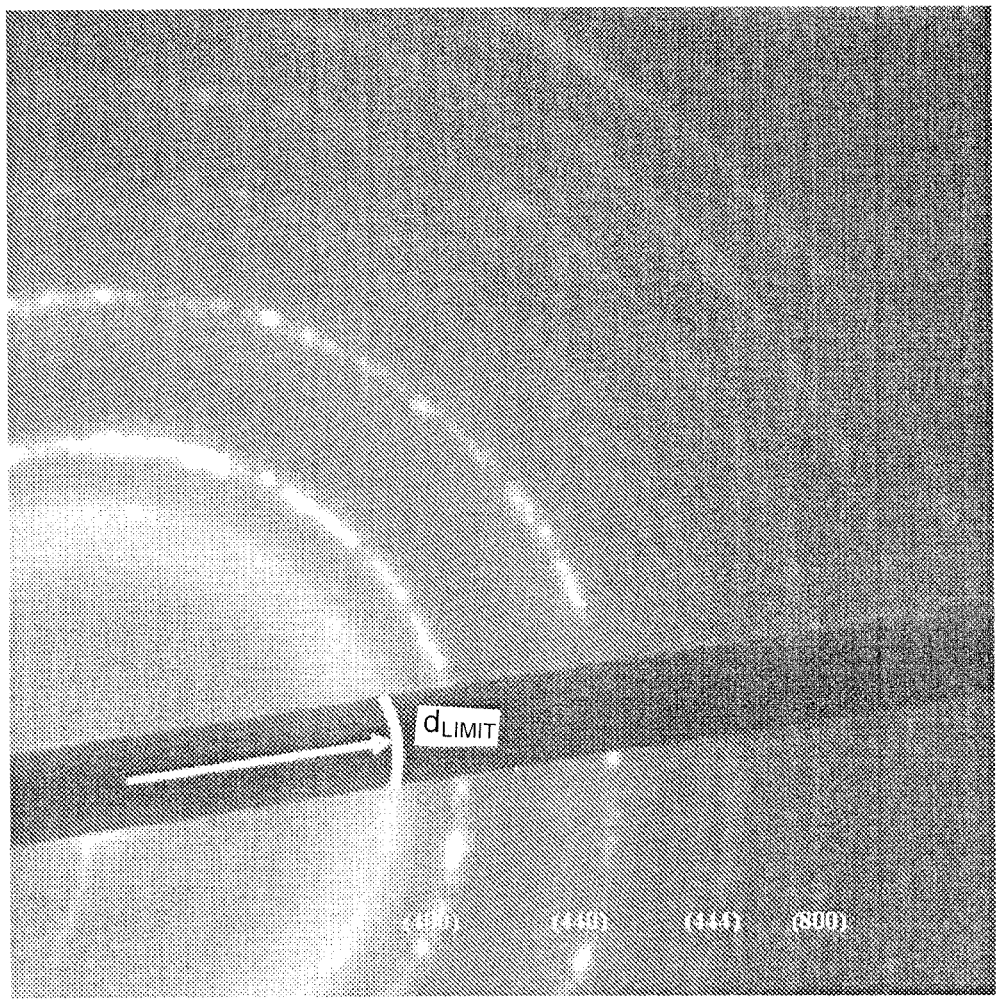
Diffraction image of an aluminium oxide layer according to the invention; $d_{LIMIT}$ is marked and point-shaped reflections which lie on the rings are indicated in accordance with Table 1

CUTTING TOOL

RELATED APPLICATION DATA

This application is a §371 National Stage Application of PCT International Application No. PCT/EP2010/053551 filed Mar. 18, 2010, and also claims priority under 35 U.S.C. §119 and/or §365 to German Application No. 10 2009 001 675.9, filed Mar. 19, 2009.

SUBJECT OF THE INVENTION

The invention concerns a cutting tool having a substrate main body and a single-layer or multi-layer coating applied thereto, wherein at least one layer of the coating is a metal oxide layer produced in the PVD process or in the CVD process.

BACKGROUND OF THE INVENTION

Cutting tools comprise a main body made for example from carbide metal, cermet, steel or high-speed steel. Frequently a single-layer or multi-layer coating is applied to the main body to increase the service lives or also to improve the cutting properties. That coating includes for example metallic hard material layers, oxide layers or the like. CVD processes (chemical vapour deposition) and/or PVD processes (physical vapour deposition) are employed to apply the coating. A plurality of layers within a coating can be applied exclusively by means of CVD processes, exclusively by means of PVD processes or by a combination of those processes.

In regard to the PVD processes a distinction is drawn between various variants in such processes such as magnetron sputtering, arc vapour deposition (arc PVD), ion plating, electron beam vapour deposition and laser ablation. Magnetron sputtering and arc vapour deposition count among the PVD processes most frequently used for coating tools. Within individual PVD process variants there are in turn different modifications such as for example unpulsed or pulsed magnetron sputtering or unpulsed or pulsed arc vapour deposition.

The target in the PVD process can comprise a pure metal or a combination of two or more metals. If the target includes a plurality of metals then all those metals are simultaneously incorporated into the layer of a coating, which is built up in the PVD process.

The quantitative ratio of the metals relative to each other in the layer which is built up will depend on the quantitative ratio of the metals in the target, but also on the conditions in the PVD process as individual metals are dissolved out of the target in higher quantities under given conditions and/or are deposited on the substrate in higher quantities, than other metals. Besides the pure metals, oxidic, nitridic, carbidic forms of the metals or mixtures thereof are also used in targets.

To produce given metal compounds reactive gases are fed to the reaction chamber of the PVD process, for example nitrogen for producing nitrides, oxygen for producing oxides, carbon-bearing compounds for producing carbides, carbonitrides, oxycarbides etc. or mixtures of those gases to produce corresponding mixed compounds.

In the PVD process a so-called bias potential is generally applied to the substrates to be coated in order to achieve the surface energy necessary for the growth process, and thus atomic mobility. The energy is necessary to achieve crystalline structures in a growing layer. When applying insulating layers using the PVD process, which applies for example to a large number of metal oxide compounds, the effectively applied bias potential is reduced during the growth process with increasing layer thickness, because of the insulating properties of the layer material, and that worsens the growth conditions at the layer surface and in addition can ultimately lead to exclusively or primarily amorphous structures being grown.

Ramm, J. et al., Pulse enhanced electron emission (P3e™) arc evaporation and the synthesis of wear resistant Al—Cr—O coatings in corundum structure, Surface and Coatings Technology 202 (2007), pages 876-883, describe the deposit of aluminium oxide-chromium oxide layers by pulsed arc vapour deposition (arc PVD). The deposited layers firstly present a mixed crystal structure.

Teixeira, V. et al., Deposition of composite and nanolaminate ceramic coatings by sputtering, Vacuum 67 (2002), pages 477-483, describe the deposit of thin zirconium oxide/aluminium oxide layers in the nanometer range by magnetron sputtering. The layers exhibit crystalline components of zirconium oxide, but only amorphous components of aluminium oxide.

Trinh, D. H. et al., Radio frequency dual magnetron sputtering deposition and characterization of nanocomposite Al2O3—ZrO2 thin films, J. Vac. Sc. Techn. A 24(2), March/April 2006, pages 309-316, describe the deposit of very thin zirconium oxide/aluminium oxide layers in the nanometer range by magnetron sputtering, which present crystalline components of tetragonal zirconium oxide but only amorphous components of aluminium oxide.

WO-A-2007/121954 describes the production of a hard substance layer on a substrate by means of magnetron sputtering, wherein the hard substance layer contains the metallic elements Al, Cr and Si as well as non-metallic elements from the group B, C, N and O. The atomic proportion of oxygen in the non-metallic elements is greater than 30%. The hard substance layer preferably contains crystalline phases and/or mixed phases in the system Al—Cr—Si—O. Both cubic phases of the space group Fd3m and also hexagonal phases of the space group R-3C can be formed.

EP-A-1 029 105 and EP-A-1 253 215 describe coated cutting tools for metal machining with a carbide metal, cermet or ceramic body and a hard and wear-resistant and heat-resistant coating which is deposited using the DMS (dual magnetron sputtering)-PVD method, wherein at least one layer and preferably the outermost layer comprises $Al_2O_3$ and further layers if at all present are produced between the tool body and the $Al_2O_3$ layer from metal nitrides and/or carbides of the metallic elements Ti, Nb, Hf, V, Ta, Mo, Zr, Cr, W and/or Al. The $Al_2O_3$ layers comprise dense, fine-grain, crystalline γ-$Al_2O_3$ and can also include other phases from the γ-series.

Thus purely crystalline and purely amorphous systems as well as systems with crystalline grains in an amorphous matrix are known from the state of the art. The crystalline phases include binary systems or mixed crystals of known crystal systems.

X-ray and electron diffraction are used as methods of investigating metal oxide layers in order to determine the lattice plane spacings occurring in the crystal structure (d-values) and/or to demonstrate amorphous structures. In that respect electron diffraction is more advantageous in relation to X-ray diffraction because of the lower wavelength for investigating disordered grains involving grain sizes of 10-50 nm.

OBJECT

The object of the present invention was that of providing coated cutting tools which are improved in comparison with the state of the art, in particular those which, in comparison with cutting tools involving a similar coating structure, have a higher level of hardness, improved wear properties and/or improved (reduced) thermal conductivity.

DESCRIPTION OF THE INVENTION

The object according to the invention is attained by a cutting tool having a substrate main body and a single-layer or multi-layer coating applied thereto, wherein at least one layer of the coating is a metal oxide layer produced in the PVD process or in the CVD process and the metal oxide layer has a grain structure in which there are present within a plurality of the existing grains structural disorders which are characterised in that point-shaped reflections occur in the electron diffraction images of the grains up to a maximum lattice plane spacing $d_{LIMIT}$ and for lattice plane spacings of greater than $d_{LIMIT}$ no point-shaped reflections occur, but an intensity distribution that is typical for amorphous structures.

The preferred method of electron diffraction is transmission electron microscopy (TEM), but other methods of producing electron diffraction images are also known and suitable.

The intensity distribution which is typical of amorphous structures is also to be referred to as diffuse. If reference is made herein to a plurality of the existing grains which have the structure according to the invention, that means a predominant number in relation to other grains in the same layer, preferably over 50%, particularly preferably over 70% and quite particularly preferably over 90%.

Electron diffraction images of the grain structure according to the invention in the metal oxide layer were evaluated in respect of the d-values (lattice plane spacings) and for the crystal structure according to the invention involving disorder in respect of the grains of the metal oxide layer it was found that point-shaped reflections occurred only up to a given d-value ($d_{LIMIT}$) while for greater lattice plane spacings d (lower scatter angles) above the $d_{LIMIT}$ no point-shaped reflections which were arranged on rings were now observed, but rather there was an intensity distribution in respect of the scattered electrons, as is to be found in amorphous structures. Upon a comparison of the experimentally obtained d-values with the d-values to be expected (which are available in table form for the respective compound (for example ICSD Database)) it was established that reflections which should have a d-value of greater than $d_{LIMIT}$ were missing. With lattice plane spacings greater than $d_{LIMIT}$ at least one reflection which would be expected or found in the ordered structure of the same compound was missing in the diffraction image of the structure according to the invention.

A diffraction image as is typical of such a crystal structure of a metal oxide layer according to the invention is shown in FIG. 1 for an aluminium oxide layer. The d-value $d_{LIMIT}$ is plotted and shows that point-shaped reflections arranged on rings are observed only for d-values d<c. In the diffraction image the d-value rises towards the centre point of the rings or the disc-shaped reflections.

Table 1 hereinafter shows the experimentally determined d-values in comparison with the d-values expected for gamma aluminium oxide. In this case $d_{LIMIT}$ was 0.2 nm and all reflections with a lattice plane spacing>0.2 nm, which should occur for the crystal structure of gamma aluminium oxide, were not observed. The limit value $d_{LIMIT}$ can be precisely determined from electron-microscopic diffraction images and thus makes it possible to quantify the disorder of the crystal structure in the metal oxide layer. Proof that the grains in the metal oxide layer actually involve a structure with lacking long-range order is afforded in that point-shaped reflections arranged on rings occur in a region of the diffraction image ($d<d_{LIMIT}$) and an intensity profile as is typical of amorphous structures occurs in the complementary image region ($d>d_{LIMIT}$) and that a grain provides intensity distributions proportionately to its grain volume in both image regions of the diffraction image. The latter was demonstrated by way of the dark field images in the TEM.

TABLE 1

| hkl | tabled data d-values [Å] | experimentally determined d-values |
|---|---|---|
| 111 | 4.58 | — |
| 220 | 2.81 | — |
| 311 | 2.39 | — |
| 222 | 2.29 | — |
| 400 | 1.98 | 1.96 |
| 422 | 1.62 | 1.51 |
| 511 | 1.52 | 1.38 |
| 440 | 1.40 | 1.18 |
| 444 | 1.14 | 1.13 |
|  |  | 0.99 |
|  |  | 0.87 |
|  |  | 0.80 |

The metal oxide layer present in the coating of the tool according to the invention has a novel structure which can best be detected by electron diffraction, preferably transmission electron microscopy (TEM) but also in combination with X-ray diffraction (XRD). It is possible to see in the electron diffraction image that a structural disorder is present within the grains characteristic of the new structure, but nonetheless there must be a kind of long-range order or crystallinity. Alternatively the novel structure can also be demonstrated by a combination of X-ray diffraction (XRD) and hardness measurement. In XRD the novel structure exhibits few but wide reflections and a very high level of intensity of the background. It is of a markedly greater hardness than a purely amorphous structure of the same composition. In accordance with the claim however the novel structure is defined therein by way of the electron diffraction data.

The definition specified herein of the metal oxide layer according to the invention with reference to the results of electron diffraction distinguishes grains of the metal oxide layer according to the invention from purely crystalline or polycrystalline structures, from amorphous structures or from structures with polycrystalline components in an amorphous matrix. The electron diffraction images of the metal oxide layer according to the invention or the grain structures in that metal oxide layer do not correspond to one of the aforementioned structures, but most likely resemble structures with polycrystalline components in an amorphous matrix. It will be noted however that in the case of such structures there are crystalline components embedded in amorphous regions or beside amorphous regions. The electron diffraction images of such structures differ from the electron diffraction images of the structures according to the invention in the characteristic features described herein so that a clear distinction is easily possible for the man skilled in the art.

Without the inventors hereby wishing to be tied down to a theory the particularity of the structure according to the invention, in accordance with the results of the electron diffraction images, is to be seen in the fact that individual grains exhibit both electron diffraction reflections which are typical of crystalline structures and also those which are typical of non-crystalline structures. That is interpreted and referred herein as "structural disorder" in a grain which otherwise appears crystalline.

Surprisingly, the structures according to the invention involve at least two advantageous properties in respect of the coating of the substrate main body and thus the entire cutting tool. It was found that coatings with a metal oxide layer of the kind according to the invention can involve a considerably higher level of hardness (Vickers hardness) than crystalline metal oxide layers which have the same or similar composition and thickness but which do not have the characteristic structural disorder or afford the characteristic electron diffraction results. In a preferred embodiment of the invention the at least one metal oxide layer, in comparison with a purely crystalline metal oxide layer of the same composition and thickness, has a Vickers hardness which is higher by 10%, preferably by 20%, further preferably by 40%, particularly preferably by 70%.

For example a Vickers hardness of 1700 HV was measured for a coarsely crystalline aluminium oxide layer deposited by means of CVD (3 μm thickness; not according to the invention). For comparison purposes an aluminium oxide layer of the same thickness (3 μm) of the kind according to the invention was deposited by means of a dual magnetron PVD process and a Vickers hardness of 2300 HV was measured. In the case of an aluminium-chromium oxide layer of the kind according to the invention, deposited by means of a dual magnetron PVD process with a mixed target (70 atomic % Al and 30 atomic % Cr) a Vickers hardness of 3800 HV was measured.

The structures according to the invention and which can be clearly distinguished in the electron diffraction image from structures not according to the invention with otherwise the same chemical composition and layer thickness therefore exhibit a marked increase in hardness in comparison with the corresponding crystalline or coarsely crystalline structures.

Without wishing to be bound down to a theory the inventors explain the extraordinary increase in hardness of the layers according to the invention in comparison with crystalline layers or layers with crystals in an amorphous matrix in accordance with the state of the art, with a change in the relative slidability of the lattice planes relative to each other. In crystalline systems of the kind according to the invention plastic deformation occurs by the crystalline lattice planes sliding against each other, wherein the lattice planes in the most densely packed structures are particularly preferred sliding planes. Disruptions in the lattice structures by severe disorder make it more difficult for the sliding movement of the lattice planes to occur and thus reduce the deformation capability and accordingly increase hardness.

Furthermore the layers according to the invention exhibit a lower degree of thermal conductivity in comparison with purely crystalline systems, and that can afford considerable advantages for the service lives of the tools. Having regard to the results of electron diffusion and the XRD measurements the inventors explain the reduction in thermal conductivity in comparison with corresponding purely crystalline systems in that the structural disorder in the grains leads to increased phonon scattering because of reduced free path lengths in the disturbed structures. Measurements showed that an $Al_2O_3$ layer according to the invention had a specific thermal conductivity lower by about 10% than a coarsely crystalline $Al_2O_3$ layer which was deposited using the CVD process. In a preferred embodiment of the invention the at least one metal oxide layer therefore had a thermal conductivity which is lower by at least 5%, preferably by at least 10%, particularly preferably by at least 15%, in comparison with a purely crystalline metal oxide layer of the same composition and thickness.

Further advantageous embodiments of the present invention are set forth hereinafter.

In an embodiment of the invention the metal oxide layer contains grains of aluminium oxide, aluminium-chromium oxide, aluminium-chromium-silicon oxide, chromium oxide, silicon oxide, yttrium-zirconium oxide, yttrium-chromium oxide or mixed oxides of the metals Al, Cr, Y, V, W, Ni, Ta, Mo, Zr, Hf and/or Si or the metal oxide layer consists grains of said substances.

In a further embodiment of the invention the metal oxide layer further includes inevitable impurities and/or manufacture-induced residues, preferably argon (Ar), nitrogen ($N_2$) and/or helium (He).

Desirably the grains in the metal oxide layer according to the invention have mean grain sizes in the range of 2 nm to 5000 nm, preferably 5 nm to 2000 nm, further preferably 10 nm to 1000 nm, particularly preferably 20 nm to 100 nm.

Advantageously the at least one metal oxide layer according to the invention can be deposited by means of a dual magnetron PVD process with the following deposition parameters:

substrate temperature of 300 to 800° C., preferably 450 to 650° C., particularly preferably about 550° C.,
substrate bias of −300 to 0 V, preferably about −150 V,
power of 5 to 50 kW, preferably about 20 kW,
oxygen flow of 50 to 300 sccm, preferably 150 sccm, with 0.2 to 0.6 Pa Ar gas.

In a further embodiment of the invention the thickness of the at least one metal oxide layer is in the range of 0.2 to 20 μm, preferably in the range of 0.5 to 10 μm, particularly preferably in the range of 1 to 5 μm.

The at least one metal oxide layer according to the invention is preferably produced by means of PVD processes which are particularly preferably selected from high power impulse magnetron sputtering (HIPIMS), reactive magnetron sputtering (rMS), arc vapour deposition (arc PVD), ion plating, electron beam vapour deposition and laser ablation.

In a further embodiment of the invention besides the at least one metal oxide layer the coating includes further layers selected from carbides, nitrides, oxides, carbonitrides, oxynitrides, oxycarbides, oxycarbonitrides, borides, boron nitrides, borocarbides, borocarbonitrides, borooxynitrides, borooxocarbides, borooxocarbonitrides and oxoboronitrides of the elements of groups IVa to VIIa of the periodic system and/or aluminium and/or silicon, including mixed-metallic phases and phase mixtures of the aforementioned compounds.

In a further embodiment of the invention the substrate main body is made from carbide metal, cermet, steel or high-speed steel (HSS).

Measurement Methods

1. Electron Diffraction (TEM)

When reference is made herein to electron diffraction experiments these are TEM measurements which were carried out with the following conditions, measurement parameters, devices and so forth.

Transmission Electron Microscope:
a) Zeiss 912 Omega
Source LaB6
Fine area aperture for electron diffraction: 750 nm or
b) Jeol 2000FXII
Source LaB6
Fine area aperture for electron diffraction: 200 nm
Sample Preparation: Surface Parallel Taking a coated substrate body, a sample 300 µm in thickness with the deposited layer was produced, parallel to the substrate surface, thinned to 100 µm, cut to shape with an ultrasound core hole borer and glued with the coating side on a grinding holder. The sample was then thinned manually to 20 µm by grinding on a diamond film with various grain sizes (50 µm, 25 µm, 9 µm and 3 µm) from the substrate side. An Al ring was then glued on and the sample was etched in the ion etching installation (Baltec RES 100) at 4 kV at 25 mA from the substrate side with argon ions and thinned until it is electron-transparent.

Sample Preparation: Cross-Section

Taking a coated substrate body, a sample with a residual thickness of 1 mm with the deposited coating is produced by separating off the substrate material parallel to the substrate surface. Two of the 1 mm thick residual portions are glued together at the surfaces (outsides of the coating; face to face), a small strip portion is sawn down from the sandwich and the strip portion is embedded in a small tube portion. The tube portion is sawn into discs, the discs are polished from both sides with diamond film and both sides are dimpled. Etching is effected from both sides with the ion etching installation PIPS with 4 kV at 25 mA.

2. XRD

When reference is made herein to XRD measurements they have been carried out with the following conditions, measurement parameters, devices and so forth.

The XRD measurements are performed in a microdiffractometer from Bruker using a radiation source with a cobalt cathode, an anode voltage of 30 KV; an anode current of 30 mA, a graphite primary monochromator (so that only the Co-K$\alpha$ radiation is used from the source). The detector was a Bruker XAS D8-GADDS Discovery Detector. The X-ray beam was focused to a diameter of 300 µm with a monocapillary.

Measurement geometry: glancing incidence (angle of incidence constant, Bragg angle was varied).

3. Determining the Vickers Hardness

When reference is made herein to Vickers hardness measurements they have been carried out with the following conditions, measurement parameters, devices and so forth.

Hardness measurements were carried out on a Fischerscope@H100 (Helmut Fischer GmbH, Sindelfingen, Germany) with a test load of 15 mN with a loading duration of 1 min (loading rate=15 mN/min). A Vickers pyramid was used as the testing tip. Resolution of the depth of penetration was ±2 nm and resolution of the load was ±0.04 mN. Prior to the measurement the sample was polished because of the surface roughness and demagnetised.

4. Determining Thermal Conductivity

When reference is made herein to thermal conductivity measurements they have been carried out with the following conditions, measurement parameters, devices and so forth.

For measuring thermal conductivity a substrate having a coating is homogenously heated to a temperature of 81° C. on just one of the surfaces. The heating is then terminated and the substrate applied with the coated side to a large metal portion which is a good heat conductor. The substrate serves as a heat reservoir in that measurement operation. The large metal portion which is a good heat conductor serves as a heating bath at an approximately constant temperature which is below the substrate heating temperature, preferably at ambient temperature. A heat flow flows through the coating from the heat reservoir to the heat bath, whereby the substrate cools down. The measurement value is the substrate temperature on the substrate side remote from the coating, as a function of time. The specific thermal conduction constant is determined from the cooling curve. The experiment is carried out under the same conditions for the various layers to be compared.

The novel coating of the present invention opens a broad spectrum of possible ways of improving and/or adapting the wear resistance, service lives and/or cutting properties of the cutting tools.

The resistance to wear, service life and cutting properties of a coating on a cutting tool depend on various factors such as for example the material of the main body of the cutting tool, the sequence, nature and composition of the layers in the coating, the thickness of the various layers and not least the nature of the cutting operation performed with the cutting tool. Different levels of resistance to wear arise for one and the same cutting tool in dependence on the nature of the workpiece to be machined, the respective machining process and the further conditions during the machining operation such as for example the development of high temperatures or the use of corrosive cooling fluids. In addition a distinction is drawn between different kinds of wear which can influence the period of use of a tool, that is to say its service life, to a greater or lesser degree, depending on the machining operation. Therefore, further development in and improvement to cutting tools is always to be considered in relation to which tool properties are to be improved and are to be assessed under comparable conditions in relation to the state of the art.

An essential property of cutting tools, which is improved by the coating according to the invention in comparison with the state of the art with coatings of the same materials is the hardness of such a coating. The markedly higher hardness of the coating according to the invention is attributed to the unique structural properties which are to be found with the coating according to the invention in accordance with TEM measurements.

The reduction in thermal conductivity of the metal oxide layer, and therewith usually also the overall layer, that is surprisingly achieved with coatings according to the invention, has a very positive effect in use of such cutting tools in the cutting machining of metals and composite materials. The reduced thermal conductivity leads to improved resistance to thermoshock and thus increased resistance to comb cracking.

It will be self-evident that all individual features as are described herein for given embodiments according to the invention, insofar as this is technically meaningful and possible, can be combined with all other described features of embodiments according to the invention and such combinations are deemed to be disclosed within the context of this description. Therefore the individual identification of all possible combinations is dispensed with herein only for reasons of better readability.

Further advantages, features and embodiments of the present invention are described by means of the Examples hereinafter.

EXAMPLES

Carbide metal substrates were provided with a single-layer coating in a dual magnetron process in a PVD coating installation (Flexicoat; Hauzer Techno Coating BV, Venlo, Netherlands). The substrate geometry was SEHW120408 or ADMT 160608-F56 (in accordance with DIN-ISO 1832). Prior to deposition of the layers the installation was evacuated to $1\times10^{-5}$ mbars and the carbide metal surface cleaned by argon ion etching with a 170 V bias voltage.

Example 1

| Metal oxide: $Al_2O_3$ | |
|---|---|
| PVD process: | dual magnetron |
| target: | Al rectangular target (81 cm × 16 cm) |
| deposition: | substrate temperature: 550° C. |
| | substrate bias voltage: −150 volts (DC pulsed 100 kHz, 2 µs off-time) |
| | power: 20 kW |
| | oxygen flow: 150 sccm with 0.6 Pa Ar gas |
| | layer thickness: 2.1 µm |

Comparative Example 1

| Metal oxide: $Al_2O_3$ | |
|---|---|
| PVD process: | single magnetron |
| target: | Al rectangular target (81 cm × 16 cm) |
| deposition: | substrate temperature: 550° C. |
| | substrate bias voltage: −120 volts |
| | power: 10 kW |
| | oxygen flow: 150 sccm with 0.6 Pa Ar gas |
| | layer thickness: 1.9 µm |

Example 2

| Metal oxide: $(Al,Cr)_2O_3$ | |
|---|---|
| PVD process: | dual magnetron |
| target: | Al/Cr— (70/30 atomic %) rectangular target (81 cm × 16 cm) |
| deposition: | substrate temperature: 550° C. |
| | substrate bias voltage: −100 volts (DC pulsed 70 kHz, 4 µs off-time) |
| | power: 20 kW |
| | oxygen flow: 150 sccm with 0.2 Pa Ar gas |
| | layer thickness: 3.3 µm |

Comparative Example 2

| Metal oxide: $(Al,Cr)_2O_3$ | |
|---|---|
| PVD process: | arc vapour deposition |
| target: | Al/Cr— (70/30 atomic %) round source (16 cm diameter) |
| deposition: | substrate temperature: 550° C. |
| | vaporiser current: 2 × 160 A |
| | bias voltage: −60 V (bipolar) |
| | oxygen flow: 500 sccm (no Ar gas) |
| | layer thickness: 2.5 µm |

The results of the TEM measurements show that the $Al_2O_3$ and $(Al, Cr)_2O_3$ layers in accordance with Examples 1 and 2 have the structure according to the invention in which there is a structural disorder within a majority of the existing grains but nonetheless there is a kind of long-range order or crystallinity. In XRD the coatings exhibit few but broad reflections and a very high level of intensity in respect of the background.

In contrast thereto the results of the TEM and XRD measurements further showed that the $Al_2O_3$ layer in accordance with Comparative Example 1 was completely amorphous and the $(Al, Cr)_2O_3$ layer in accordance with Comparative Example 2 was crystalline.

Operations for determining the Vickers hardnesses of the layers in accordance with the Examples and the Comparative Examples showed that the structures according to the invention have a markedly higher level of hardness than amorphous structures of the same composition (see Table 2).

TABLE 2

Determining the Vickers hardnesses

| | Vickers hardness [HV] |
|---|---|
| Example 1: | 2720 HV |
| Comparative Example 1: | 1064 HV |
| Example 2: | 3800 HV |
| Comparative Example 2: | 2500 HV |

Thermal Conductivity

In accordance with the above-described method, having regard to the layer thickness, the thermal conductivity of the $Al_2O_3$ coating in accordance with Example 1 was compared to a coarsely crystalline $\alpha$-$Al_2O_3$ coating (layer thickness: 5 µm) deposited in the CVD process. The thermal conductivity of the $Al_2O_3$ coating according to the invention, in accordance with Example 1, was about 10% less than that of the coating applied using the CVD process.

Milling Tests

In milling tests on a workpiece comprising 42CrMoV4 steel (1.7226; strength: 850 MPa) the cutting tools from the Examples and Comparative Examples were investigated. In those tests milling was effected in the downcut mode without cooling lubricant at a cutting speed Vc=235 m/min, a tooth advance $f_z$=0.2 mm/tooth and a cutting depth of 3 mm. The tool diameter was 125 mm, the cutting width was 98 mm, the overhang was 5 mm, the rake angle kappa was 45° and the front rake angle was 0°. The wear was measured on the relief surface as a mean wear mark width VB in mm (at the main cutting edge) after milling distances of 800 mm, 1600 mm, 2400 mm, 3200 mm, 4000 mm and 4800 mm. The following wear mark widths $V_{Bmax}$ were found (Table 3):

TABLE 3

Milling tests

| | Wear mark widths $V_{Bmax}$ [mm] | |
|---|---|---|
| Milling distance [mm] | Example 1 | Comparative Example 1 |
| 800 | 0.02 | 0.03 |
| 1600 | 0.03 | 0.05 |
| 2400 | 0.03 | 0.06 |
| 3200 | 0.04 | 0.09 |
| 4000 | 0.06 | 0.12 |
| 4800 | 0.08 | 0.13 |

The invention claimed is:
1. A cutting tool having a substrate main body and a single-layer or multi-layer coating applied thereto, wherein at least one layer of the coating is a metal oxide layer produced in the PVD process or in the CVD process, and wherein the metal oxide layer has a grain structure in which there are present within a plurality of the existing grains structural disorders, and wherein point-shaped reflections occur in the electron diffraction images of the grains up to a maximum lattice plane spacing $d_{LIMIT}$ and for lattice plane spacings of greater than $d_{LIMIT}$ no point-shaped reflections occur, but an intensity distribution that is typical for amorphous structures.

2. A cutting tool according to claim 1, wherein the maximum lattice plane spacing $d_{LIMIT}$ up to which point-shaped reflections occur in the electron diffraction images of the grains is in the range of 0.1 nm to 00.6 nm.

3. A cutting tool according to claim 2, wherein the maximum lattice plane spacing $d_{LIMIT}$ up to which point-shaped reflections occur in the electron diffraction images of the grains is in the range of 0.15 nm to 0.40 nm.

4. A cutting tool according to claim 1, wherein at least one metal oxide layer has a thermal conductivity which is lower by at least 5% in comparison with a purely crystalline metal oxide layer of the same composition and thickness.

5. A cutting tool according to claim 4, wherein the thermal conductivity is lower by at least 10%.

6. A cutting tool according to claim 5, wherein the thermal conductivity is lower by at least 15%.

7. A cutting tool according to claim 1, wherein at least one metal oxide layer has a Vickers hardness which is higher by 10% in comparison with a purely crystalline metal oxide layer of the same composition and thickness.

8. A cutting tool according to claim 7, wherein the Vickers hardness is higher by 20%.

9. A cutting tool according to claim 8, wherein the Vickers hardness is higher by 40%.

10. A cutting tool according to claim 9, wherein the Vickers hardness is higher by 70%.

11. A cutting tool according to claim 1, wherein the metal oxide layer contains grains of aluminium oxide, aluminium-chromium oxide, aluminium-chromium-silicon oxide, chromium oxide, silicon oxide, yttrium-zirconium oxide, yttrium-chromium oxide or mixed oxides of the metals Al, Cr, Y, V, W, Ni, Ta, Mo, Zr, Hf and/or Si or consists thereof.

12. A cutting tool according to claim 1, wherein the metal oxide layer further includes inevitable impurities and/or manufacture-induced residues, preferably argon (Ar), nitrogen ($N_2$) and/or helium (He).

13. A cutting tool according to claim 1, wherein the grains in the metal oxide layer have mean grain sizes in the range of 2 nm to 5000 nm.

14. A cutting tool according to claim 13, wherein the mean grain size is in the range of 5 nm to 2000 nm.

15. A cutting tool according to claim 14, wherein the mean grain size is in the range of 10 nm to 1000 nm.

16. A cutting tool according to claim 15, wherein the mean grain size is in the range of 20 nm to 100 nm.

17. A cutting tool according to claim 1, wherein at least one metal oxide layer is deposited by means of a dual magnetron PVD process with the following deposition parameters:
substrate temperature of 450 to 650° C.,
substrate bias of −300 to 0 V,
sputter power of 5 to 50 kW,
oxygen flow of 50 to 300 sccm with 0.2 to 0.6 Pa Ar gas.

18. A cutting tool according to claim 17, wherein the deposition parameters are one or more of:
substrate temperature of about 550° C.,
substrate bias of about −150V,
sputter power of about 20 kW,
oxygen flow of 150 sccm with 0.2 to 0.6 Pa Ar gas.

19. A cutting tool according to claim 1, wherein the thickness of the at least one metal oxide layer is in the range of 0.2 to 20 μm.

20. A cutting tool according to claim 19, wherein the thickness of the at least one metal oxide layer is in the range of 0.5 to 10 μm.

21. A cutting tool according to claim 20, wherein the thickness of the at least one metal oxide layer is in the range of 1 to 5 μm.

22. A cutting tool according to claim 1, wherein at least one metal oxide layer is produced by means of PVD processes selected from high power impulse magnetron sputtering (HIPIMS), reactive magnetron sputtering (rMS), arc vapour deposition (arc PVD), ion plating, electron beam vapour deposition and laser ablation.

23. A cutting tool according to claim 1, wherein besides at least one metal oxide layer the coating includes further layers selected from carbides, nitrides, oxides, carbonitrides, oxynitrides, oxycarbides, oxycarbonitrides, borides, boron nitrides, borocarbides, borocarbonitrides, borooxynitrides, borooxocarbides, borooxocarbonitrides and oxoboronitrides of the elements of groups IVa to VIa of the periodic system and/or aluminium and/or silicon, including mixed-metallic phases and phase mixtures of the aforementioned compounds.

24. A cutting tool according to claim 1, wherein the substrate main body is made from carbide metal, cermet, steel or high-speed steel (HSS).

* * * * *